United States Patent
Kimura

(10) Patent No.: US 6,329,289 B1
(45) Date of Patent: Dec. 11, 2001

(54) METHOD AND APPARATUS FOR FORMING COPPER WIRING

(75) Inventor: Norio Kimura, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/537,718

(22) Filed: Mar. 30, 2000

(30) Foreign Application Priority Data

Mar. 31, 1999 (JP) .................................. 11-092136

(51) Int. Cl.$^7$ ............................ H01L 21/00; H01L 21/44; H01L 21/30; H01L 21/461
(52) U.S. Cl. ................................. 438/689; 438/1; 438/687; 438/800
(58) Field of Search ................................. 438/1, 689, 800, 438/906, 584, 687, 597

(56) References Cited

U.S. PATENT DOCUMENTS

| | | | |
|---|---|---|---|
| 4,571,387 | * | 2/1986 | Bruynesteyn ........................ 435/262 |
| 4,822,413 | * | 4/1989 | Pooley et al. ......................... 75/118 |
| 5,030,425 | * | 7/1991 | Bowers-Irons et al. ............... 423/87 |
| 5,462,720 | * | 10/1995 | Aragones .................................. 423/27 |

FOREIGN PATENT DOCUMENTS

| | | | |
|---|---|---|---|
| 406316800-A | * | 11/1994 | (JP) .................................. C25F/3/02 |
| 409302423-A | * | 11/1997 | (JP) .................................. C22B/3/18 |

OTHER PUBLICATIONS

Yoshiyuki UNO et al., "Micromachining of Metals Using Microorganism", Materia Japan, vol. 37, No. 1, pp. 52–54, The Japan Institute of Metals, Jan. 20, 1998 (with partial English translation).

* cited by examiner

Primary Examiner—Richard Elms
Assistant Examiner—Adam Pyonin
(74) Attorney, Agent, or Firm—Wenderoth, Lind & Ponack, L.L.P.

(57) ABSTRACT

A copper layer is formed in wiring grooves formed in a semiconductor substrate and also on the semiconductor substrate. The semiconductor substrate is brought into contact with a culture solution containing bacteria whose size is larger than the width of the wiring grooves. The copper layer on the semiconductor substrate is removed by the bacteria comprising autotroph, but the copper layer in the wiring grooves is not removed because the bacteria cannot enter the wiring grooves.

6 Claims, 3 Drawing Sheets

F I G. 2A
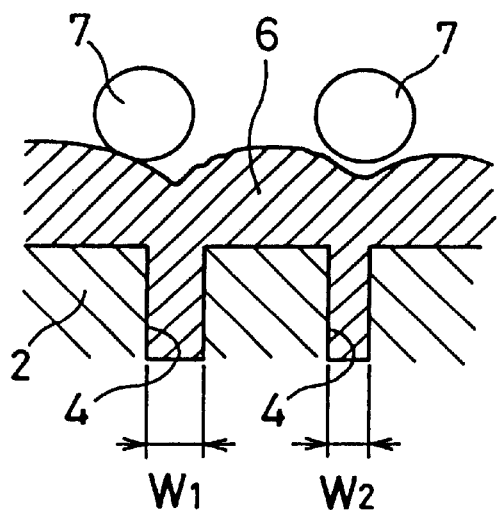
F I G. 2B
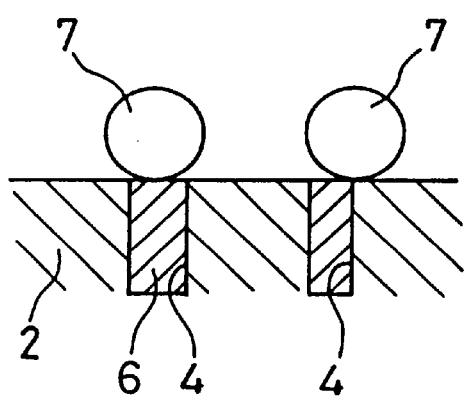
F I G. 3
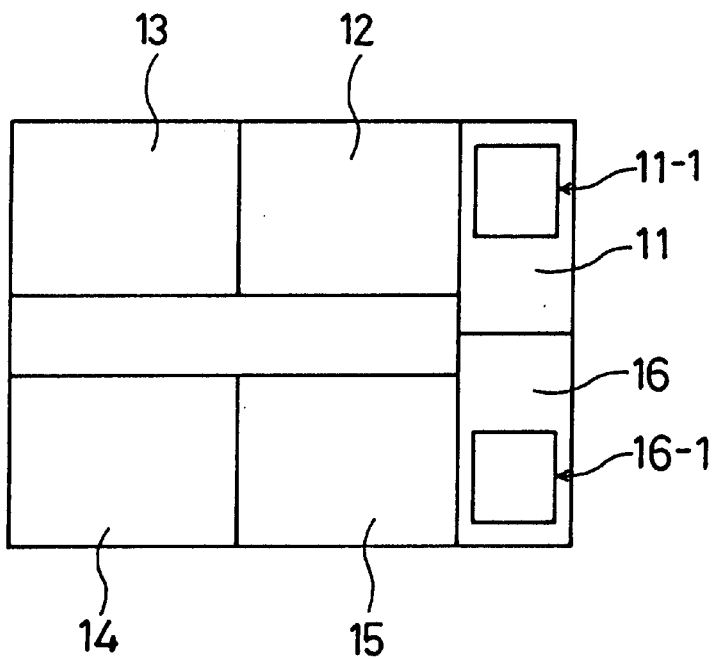

METHOD AND APPARATUS FOR FORMING COPPER WIRING

BACKGROUND OF THE INVENTION

1. Field of the invention

The present invention relates to a method and apparatus for forming copper wiring, and more particularly to a method and apparatus for forming copper wiring on a substrate such as a semiconductor wafer.

2. Description of the Related Art

Conventionally, in order to form a wiring circuit on a semiconductor substrate, a conductive film is deposited over a surface of a substrate by a sputtering process or the like, and then unnecessary portions are removed from the conductive film by a chemical dry etching process using a photoresist for a mask pattern.

Generally, aluminum or aluminum alloy has been used as a material for forming a wiring circuit. However, the higher integration of integrated circuits on the semiconductor substrate in recent years requires narrower wiring to thus increase the current density, resulting in generation of thermal stress in the wiring and increase in the temperature of the wiring. This unfavorable condition becomes more significant, as wiring material such as aluminum is thinner due to stress-migration or electromigration, to finally cause a breaking of the wire or a short circuit.

Hence, in order to prevent the wiring from generating excess heat while current flows, a material such as copper having a higher electrical conductivity is required to be used for a wiring circuit. However, since copper or copper alloy is not suited for the dry etching process, it is difficult to adopt the above-mentioned method in which the wiring pattern is formed after depositing the conductive film over the whole surface of the substrate. Therefore, one possible process is to form grooves for a wiring circuit having a predetermined pattern, and then fill the grooves with copper or copper alloy. This process eliminates the etching process of removing unnecessary portions of the film, and needs only a polishing process of removing unevenness or irregularities of the surface. Further, this process offers advantages that portions called wiring holes connecting between an upper layer and a lower layer in a multilayer circuit can be formed at the same time.

However, as the width of wiring becomes narrower, such wiring grooves or wiring holes have a considerably higher aspect ratio (the ratio of depth to diameter or width), and hence it is difficult to fill the grooves or the holes with metal uniformly by the sputtering process. Further, although a chemical vapor deposition (CVD) process is used to deposit various materials, it is difficult to prepare an appropriate gas material for copper or copper alloy, and if an organic material is used for depositing copper or copper alloy, carbon (C) is mixed into a deposited film to increase migration of the film.

Therefore, there has been proposed a method in which a substrate is dipped in a plating solution to plate the substrate with copper by an electrolytic plating or an electroless plating, and then the unnecessary portion of a copper layer is removed from the substrate by a chemical mechanical polishing (CMP) process. This formation of the film or layer by the plating allows wiring grooves having a high aspect ratio to be uniformly filled with a metal having a high electrical conductivity. In the CMP process, a semiconductor wafer held by the top ring is pressed against a polishing cloth attached to a turntable, while supplying a polishing liquid containing abrasive particles and thus the copper layer on the semiconductor substrate is polished.

However, in the CMP process described above, the pattern density dependence on the properties of the polishing cloth and the polishing liquid is large, and copper wiring portions are excessively polished in the form of a plate or a dish. This excessively polished phenomenon is called "dishing".

SUMMARY OF THE INVENTION

The present invention has been made to solve the above drawbacks in the CMP process. It is therefore an object of the present invention to provide a method and apparatus for forming copper wiring which can uniformly remove a copper layer formed on a substrate such as a semiconductor wafer, and form copper wiring having a flat and uniform surface in narrow grooves and/or minute holes in the substrate without forming dishing.

According to a first aspect of the present invention, there is provided a method for forming copper wiring on a semiconductor substrate, comprising: filling wiring grooves formed in a semiconductor substrate with copper and forming a copper layer on the semiconductor substrate; bringing the semiconductor substrate into contact with a culture solution containing bacteria whose size is larger than the width of the wiring grooves; and removing the copper layer on the semiconductor substrate by the bacteria while leaving the copper in the wiring grooves.

In a preferred embodiment, the semiconductor substrate is cleaned to remove the bacteria after removing the copper layer on the semiconductor substrate.

In a preferred embodiment, the bacteria comprises autotroph.

According to a second aspect of the present invention, there is provided an apparatus for forming copper wiring on a semiconductor substrate, comprising: a device for filling wiring grooves formed in a semiconductor substrate with copper and forming a copper layer on the semiconductor substrate; and a container for holding a culture solution containing bacteria therein; wherein the semiconductor substrate is brought into contact with the culture solution containing bacteria whose size is larger than the width of the wiring grooves, and the copper layer on the semiconductor substrate is removed by the bacteria while leaving the copper in the wiring grooves.

Organisms can be broadly classified into heterotroph and autotroph according to the way to obtain the carbon source. An organism which obtains the carbon source from other organic materials is referred to as a heterotroph, and an organism which obtains the carbon source by fixing carbon dioxide contained in the air is referred to as an autotroph. The autotroph includes the chemoautotroph which obtains the energy by oxidizing inorganic materials. Further, the chemoautotroph includes a bacterium, "thiobacillus ferrooxidans". This bacterium lives by fixing carbon dioxide in the air using the energy which is generated by oxidization of iron, sulfur, or copper. The bacteria react with copper to remove copper at a rate of about 3000 Å per minute by imparting a certain vibration to a culture solution in which pure copper and the bacteria are placed. The size of this bacterium is about 0.5 $\mu$m in diameter and about 1 $\mu$m in length, and the shape of the bacterium is approximately cylindrical.

The present invention utilizes the size of bacterium and the size (width) of the wiring groove.

The width of wiring on the semiconductor substrate has been becoming narrower from 0.3 $\mu$m to 0.25 $\mu$m, 0.2 $\mu$m, and 0.17 μm in recent years. If bacteria whose size is larger than the width of such narrow wiring are adopted, a copper layer on the copper wiring can be removed, but a copper layer in the wiring groove cannot be removed because the bacteria cannot enter the copper wiring. Therefore, the copper wiring whose width is smaller than the size of the bacteria is not removed, and the copper wiring remains in a substantially flat surface.

The above and other objects, features, and advantages of the present invention will be apparent from the following description when taken in conjunction with the accompanying drawings which illustrate a preferred embodiment of the present invention by way of example.

BRIEF DESCRIPTION OF THE DRAWINGS

FIGS. 2A and 2B are schematic diagrams showing the conditions of bacteria and wiring grooves during the process of removing a copper layer;

FIG. 3 is a schematic plan view showing a copper wiring apparatus according to an embodiment of the present invention.

DETAILED DESCRIPTION OF THE PREFERRED EMBODIMENTS

A method and an apparatus for forming copper wiring according to an embodiment of the present invention will be described below with reference to FIGS. 1A through 4.

Figure 1A:
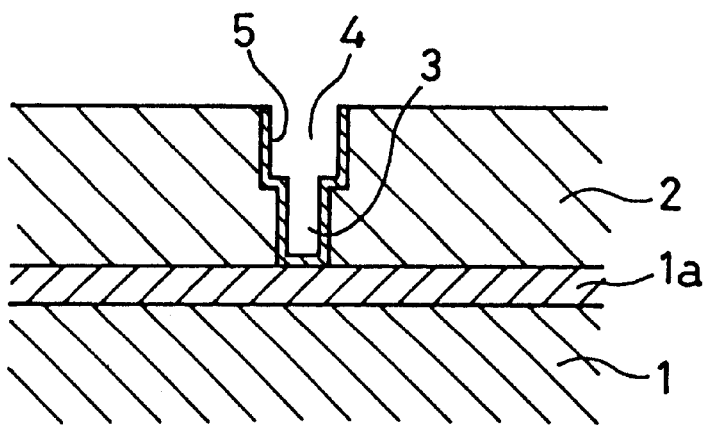
FIGS. 1A, 1B, and 1C are schematic diagrams showing processes of forming a copper wiring according to an embodiment of the present invention.
Figure 1B:
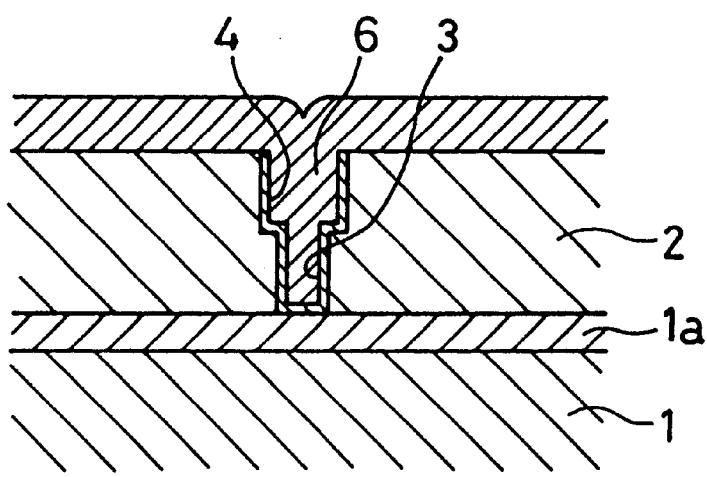
Figure 1C:
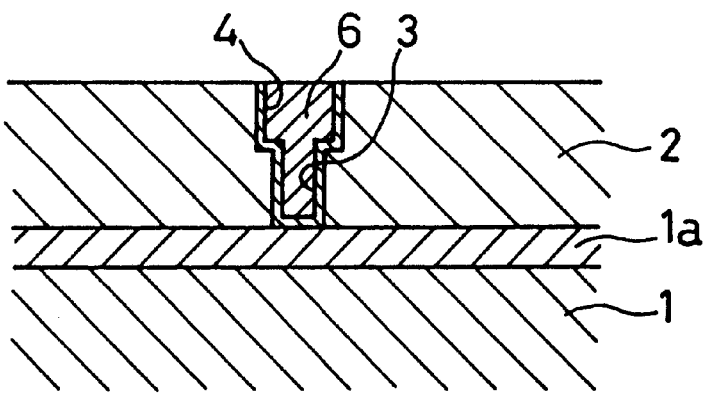

FIGS. 1A, 1B, and 1C are schematic diagrams showing processes of forming a copper wiring according to an embodiment of the present invention. As shown in FIG. 1A, an insulating film 2 of $SiO_2$ is deposited over an electrically conductive layer 1a on a semiconductor substrate 1 having a semiconductor device, and then wiring portions composed of wiring holes (contact holes) 3 and wiring grooves 4 are formed by a lithography etching technology. In FIGS. 1A through 1C, only one wiring hole 3 and one wiring groove 4 are shown. Further, a barrier layer 5 made of TiN or the like is formed therein.

Subsequently, as shown in FIG. 1B, each of the wiring portions composed of the wiring hole 3 and the wiring groove 4 on the semiconductor substrate 1 is filled with copper, and a copper layer 6 is formed on the insulating film 2 by a plating process or the like. Then, the copper layer on the insulating film 2 is removed by action of bacteria, but the copper layer in the wiring hole 3 and the wiring groove 4 is not removed to thus form the remaining copper layer having a surface flush with a surface of the insulating film 2. As a result, as shown in FIG. 1C, the wiring portion comprising copper in the wiring hole 3 and the wiring groove 4 is formed.

Next, the process from the condition shown in FIG. 1B to the condition shown in FIG. 1C, i.e., the process of removing a copper layer will be described below. First, bacteria whose size is larger than the width of the copper wiring portion are selected. For example, if the width of the copper wiring portion is 0.25 μm, bacterium whose diameter is approximately 0.5 μm may be selected. This selecting process of bacteria is preferably carried out by a centrifugation or an immersion filtration.

Subsequently, the semiconductor substrate 1 to be processed is immersed into a culture solution containing the selected bacteria having a given size in diameter to remove the copper layer by action of the bacteria. At this time, a voltage is applied between the surface, to be processed, of the semiconductor substrate 1 and the culture solution while vibrating the container holding the culture solution.

FIGS. 2A and 2B are schematic diagrams showing the conditions of bacteria 7 and wiring grooves 4 during the process of removing a copper layer. In FIGS. 2A and 2B, only wiring grooves are shown, but wiring holes are not shown. As shown in FIGS. 2A and 2B, the size of bacteria 7 is larger than the widths W1, W2 of the wiring grooves 4, so that bacteria 7 cannot enter wiring grooves 4. Therefore, although a copper layer 6 on the insulating film 2 is removed, copper layers 6 in the wiring grooves 4 are not removed. During this removing process, the copper layer 6 which is being processed can be monitored by a sensor utilizing eddy current, electrical resistance, or color of the substrate.

When the removing process is completed, i.e., the condition shown in FIG. 2B is achieved, the semiconductor substrate 1 is taken out of the culture solution, and the processed surface of the semiconductor substrate 1 is cleaned by a cleaning apparatus to remove organic substances therefrom. In this case, in order to remove organic substances, it is appropriate to clean the semiconductor substrate 1 by chemicals such as a sulfuric acid-hydrogen peroxide mixture (a generic name of a mixture of sulfuric acid and hydrogen peroxide) or DHF (dilute hydrofluoric acid).

FIG. 3 is a schematic plan view showing a copper wiring apparatus according to an embodiment of the present invention. As shown in FIG. 3, the copper wiring apparatus comprises a loading section 11 for loading the semiconductor substrates, a copper plating container 12 for plating the semiconductor substrates with copper therein, a washing section 13 for washing the plated semiconductor substrates, and a copper layer removing section 14 for removing a copper layer from each of the semiconductor substrates. The copper wiring apparatus further comprises a cleaning section 15 for cleaning the semiconductor substrates after the copper layer removing process, and an unloading section 16 for unloading the semiconductor substrates having the wiring portions. Further, the copper wiring apparatus comprises a delivery device (not shown) for delivering the semiconductor substrates to the respective sections.

Figure 4:
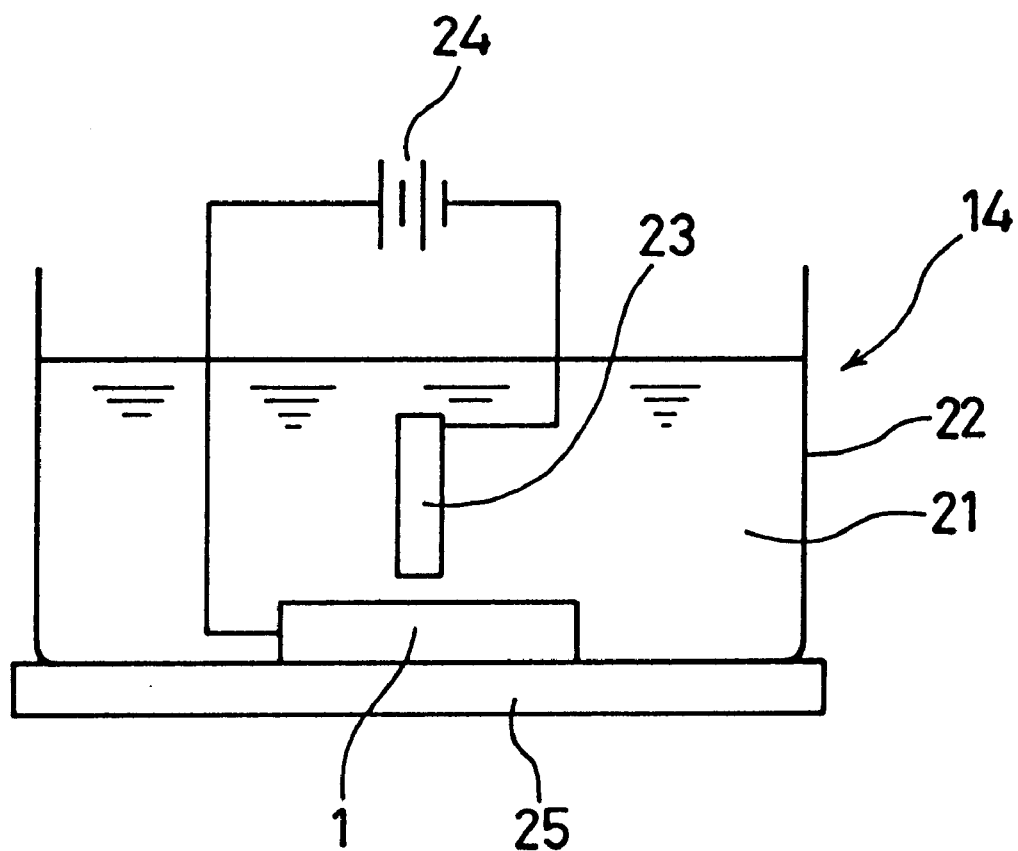
FIG. 4 is a schematic vertical cross-sectional view showing a copper layer removing section shown in FIG. 3.

FIG. 4 is a schematic cross-sectional view showing the copper layer removing section 14 in FIG. 3. As shown in FIG. 4, the copper layer removing section 14 comprises a liquid bath (container) 22 for holding a culture solution 21 containing bacteria, a DC power supply 24 for applying a voltage between the semiconductor substrate 1 immersed into the culture solution 21 and an electrode 23, and a vibrator 25 for vibrating the liquid bath 22 holding the culture solution 21.

In the copper wiring apparatus shown in FIGS. 3 and 4, the substrate delivery device takes out a semiconductor substrate having no wiring from a wafer cassette 11-1 placed on the loading section 11, and delivers it to the copper plating container 12. In the copper plating container 12, as shown in FIGS. 1B and 2A, a copper layer 6 is formed on the semiconductor substrate 1 having the wiring portions composed of wiring grooves and wiring holes (contact holes) 3. At this time, the wiring grooves and the wiring holes are filled with copper.

Then, the semiconductor substrate 1 having the wiring portions thereon is delivered to the washing section 13 by the substrate delivery device and washed by water therein. Thereafter, the semiconductor substrate 1 is delivered to the copper layer removing section 14 by the substrate delivery device. In the copper layer removing section, as shown in FIGS. 1C and 2B, the copper layer 6 on the insulating film 2 of the semiconductor substrate 1 is removed, but the copper layer in the wiring grooves 4 and the wiring holes 3 is not removed. In this case, while the vibrator 25 imparts a vibration to the liquid bath 22 with a predetermined frequency, amplitude, and in a predetermined direction, the DC power supply 24 applies a positive voltage to the surface, to be processed, of the semiconductor substrate 1 to activate the activity of the bacteria, thereby removing the copper layer.

Next, as described above, the semiconductor substrate 1, in which the copper layer 6 on the insulating film 2 of the semiconductor substrate 1 is removed, but the copper layer formed in the wiring portions composed of the wiring grooves 4 and the wiring holes 3 is not removed, is delivered to the cleaning section 15 by the substrate delivery device. In the cleaning section 15, the semiconductor substrate is cleaned by chemicals, and then, cleaned by water and dried. The dried semiconductor substrate is put into a wafer cassette 16-1 placed on the unloading section 16 as the semiconductor substrate having the copper wiring.

In the above embodiment, although the copper layer is formed by the copper plating process, the copper layer may be formed by other process such as a sputtering process.

As described above, according to the present invention, a copper layer deposited over a substrate such as a semiconductor wafer can be uniformly removed, and flat and uniform copper wiring in narrow grooves and/or minute holes in the substrate can be formed without forming dishing.

Although certain preferred embodiments of the present invention have been shown and described in detail, it should be understood that various changes and modifications may be made therein without departing from the scope of the appended claims.

What is claimed is:

1. A method for forming copper wiring on a semiconductor substrate, comprising:
    filling wiring grooves formed in a semiconductor substrate with copper and forming a copper layer on the semiconductor substrate;
    bringing said semiconductor substrate into contact with a culture solution containing bacteria whose size is larger than the width of said wiring grooves; and
    removing said copper layer on said semiconductor substrate by said bacteria while leaving said copper in said wiring grooves.

2. A method according to claim 1, wherein said copper layer on said semiconductor substrate is formed by plating.

3. A method according to claim 1, wherein said bacteria comprise autotroph.

4. A method according to claim 1, further comprising cleaning said semiconductor substrate for removing said bacteria after removing said copper layer on said semiconductor substrate.

5. A method according to claim 1, further comprising applying a voltage to a surface, to be processed, of said semiconductor substrate to control an activity of said bacteria.

6. A method according to claim 1, further comprising imparting a vibration to said culture solution containing said bacteria.

* * * * *